(12) United States Patent
Pomerantz et al.

(10) Patent No.: US 7,775,443 B2
(45) Date of Patent: Aug. 17, 2010

(54) PORTABLE DATA STORAGE DEVICE AND PACKAGING METHOD

(75) Inventors: Itzhak Pomerantz, Kfar Saba (IL); Hagai Heshes, Hod Hasharon (IL); Erez Baum, Rehovot (IL)

(73) Assignee: Sandisk IL Ltd., Kfar, Saba (IL)

( * ) Notice: Subject to any disclaimer, the term of this patent is extended or adjusted under 35 U.S.C. 154(b) by 992 days.

(21) Appl. No.: 11/399,381

(22) Filed: Apr. 7, 2006

(65) Prior Publication Data
US 2007/0055822 A1    Mar. 8, 2007

Related U.S. Application Data

(60) Provisional application No. 60/714,216, filed on Sep. 6, 2005.

(51) Int. Cl.
*G06K 19/06* (2006.01)
(52) U.S. Cl. .................. 235/492; 235/486; 235/487
(58) Field of Classification Search .......... 235/492, 235/486, 487
See application file for complete search history.

(56) References Cited

U.S. PATENT DOCUMENTS

| | | | | |
|---|---|---|---|---|
| 5,857,564 A | * | 1/1999 | Hymowitz | 206/209 |
| 2003/0111539 A1 | * | 6/2003 | Cheung | 235/487 |

* cited by examiner

*Primary Examiner*—Ahshik Kim
(74) *Attorney, Agent, or Firm*—Vierra Magen Marcus & DeNiro LLP (57) ABSTRACT

A portable data storage device (such as a USB flash drive) including a housing shaped to facilitate a reversible packaging of at least one such portable data storage device into an object having a shape of a ring, preferably having dimensions of a standard CD ROM, a non-volatile memory within the housing for storing digital information, and a connecting mechanism protruding from the housing for reversibly operationally connecting the non-volatile memory to a host. The housing includes a mechanism for reversibly packaging together the portable data storage device to other such portable data storage devices. The scope of the invention also includes a method of distributing such portable data storage devices.

21 Claims, 12 Drawing Sheets

PORTABLE DATA STORAGE DEVICE AND PACKAGING METHOD

CROSS-REFERENCE TO RELATED APPLICATIONS

This patent application claims the benefit of U.S. Provisional Patent Application No. 60/714,216, filed Sep. 6, 2005.

FIELD OF THE INVENTION

The present invention relates generally to portable data storage devices. More particularly, the present invention relates to a USB flash drive (UFD), substantially designed as a sector of a ring.

BACKGROUND OF THE INVENTION

The Universal Serial Bus (USB) standard is an external peripheral interface standard for communication between a computer and external peripherals over a cable using bi-serial transmission. USB flash drives (UFDs) are well known in the art of digital computers as portable data storage devices integrated with a USB interface. UFDs are commercially packaged in a large variety of shapes and forms, mainly in accordance with the way they are to be carried and stored.

An important application of UFDs is the storage of multimedia content, such as music, video and photographs. For this application, CD ROMs (referred herein as CDs) and DVDs are a very popular storage media. Users typically keep their CDs and DVDs in pocket albums and storage racks that are designed to store CDs or CD cases.

However, UFDs known in the art are packaged to be carried and stored as a single unit that does not resemble the design of standard CDs.

There is thus a widely recognized need for, and it would be highly advantageous to have, an innovative portable data storage device, such as a USB flash drive (UFD), substantially designed as a sector of a ring to allow packaging multiple UFDs in a standard design (e.g. CD ROM, DVD, etc.) for storage and porting.

SUMMARY OF THE INVENTION

Accordingly, it is a principal object of the present invention to overcome the disadvantages of prior art techniques used for packaging together USB flash drives (UFDs).

The present invention is a portable data storage device, such as a USB flash drive (UFD), shaped substantially as a sector of a ring, to allow packaging together multiple UFDs into a shape of a ring for storage and porting. The shape of the ring may have dimensions of a standard CD ROM (12 cm Diameter), DVD, etc.

In accordance with the present invention, there is provided a portable data storage device including: (a) a housing shaped to facilitate a reversible packaging of the portable data storage device into an object having a shape of a ring; (b) a non-volatile memory, within the housing, for storing digital information; and (c) a connecting mechanism for reversibly operationally connecting the non-volatile memory to a host.

Preferably, the portable data storage device further including a ring-sector shaped protective cover having an aperture angle that is substantially 360 degrees minus an aperture angle of the portable data storage device.

Alternatively, the portable data storage device further including a plurality ring-sector shaped protective covers, each having a respective aperture angle, such that the sum of all aperture angles substantially equals 360 degrees minus an aperture angle of the portable data storage device.

Preferably, the housing is shaped substantially as a sector of a ring.

Preferably, the housing includes a mechanism for reversibly packaging together the portable data storage device with other such portable data storage devices. More preferably, this mechanism includes respective snap latches on opposite sides of the housing. Also more preferably, the mechanism is for packaging the portable data storage devices together in a substantially co-planar manner, Alternatively, the mechanism is for packaging the portable storage devices together substantially in a shape of a complete ring. Most preferably, this shape of the complete ring has dimensions of a standard CD ROM.

Preferably, the connecting mechanism is a USB connector.

In accordance with the present invention, there is further provided a method for packaging a portable data storage device including the steps of: (a) configuring a housing of the portable data storage device to facilitate a reversible packaging of the portable data storage device in a ring-shaped object; and (b) reversibly packaging the portable data storage device in the ring-shaped object.

Preferably, the housing is shaped substantially as a sector of the ring-shaped object.

Preferably, the packaging yields a substantially co-planar collection of a plurality of the portable data storage devices. Alternatively, the packaging yields a collection of a plurality of portable data storage devices shaped substantially as a complete ring. Most preferably, this shape of the complete ring has dimensions of a standard CD ROM.

Preferably, the portable data storage device is reversibly packaged in the ring-shaped object with a ring-sector shaped protective cover having an aperture angle that is substantially 360 degrees minus an aperture angle of the portable data storage device.

Alternatively, the portable data storage device is reversibly packaged in the ring-shaped object with a plurality of ring-sector shaped protective covers each having a respective aperture angle, such that a sum of all of said aperture angles substantially equals 360 degrees minus an aperture angle of the portable data storage device.

In accordance with the present invention, there is further provided a method of distributing at least one portable data storage device including the steps of: (a) configuring a housing of each portable data storage device to facilitate a reversible packaging of the portable data storage device in a ring-shaped object; and (b) reversibly packaging the portable data storage device with other similarly configured devices.

Preferably, the packaging yields a collection of a plurality of portable data storage devices shaped substantially as a complete ring. Most preferably, this shape of a complete ring has dimensions of a standard CD ROM.

Preferably, the portable data storage device is reversibly packaged in the ring-shaped object with a ring-sector shaped protective cover having an aperture angle that is substantially 360 degrees minus an aperture angle of the portable data storage device.

Alternatively, the portable data storage device is reversibly packaged in the ring-shaped object with a plurality of ring-sector shaped protective covers, each having a respective aperture angle, such that the sum of all aperture angles substantially equals 360 degrees minus an aperture angle of the portable data storage device.

BRIEF DESCRIPTION OF THE DRAWINGS

For a better understanding of the invention with regard to the embodiments thereof, reference is made to the accompanying drawing, in which like numerals designate corresponding sections or elements throughout, and in which.

DETAILED DESCRIPTION OF THE PREFERRED EMBODIMENTS

The present invention is a portable data storage device, such as a USB flash drive (UFD), shaped substantially as a sector of a ring, to allow packaging together multiple UFDs into a shape of a ring for storage and porting. The shape of the ring may have dimensions of a standard CD ROM (12 cm Diameter), DVD, etc.

In accordance with one embodiment, a mechanism is provided for reversibly packaging together the portable data storage device of the present invention with other such portable data storage devices.

Packaging together multiple UFDs in a substantially coplanar manner is provided by the present invention as optional.

The portable data storage device of the present invention includes a non-volatile memory within a housing for storing digital information and a connecting mechanism for reversibly operationally connecting the non-volatile memory to a host.

It should be noted that the term "ring" is used in the present invention in a general sense for an object of any closed shape (not necessarily circular) that may have convex and concave parts, with a hole in the center of the object. A sector refers herein to a sub-object formed by cutting the object.

Figure 1:
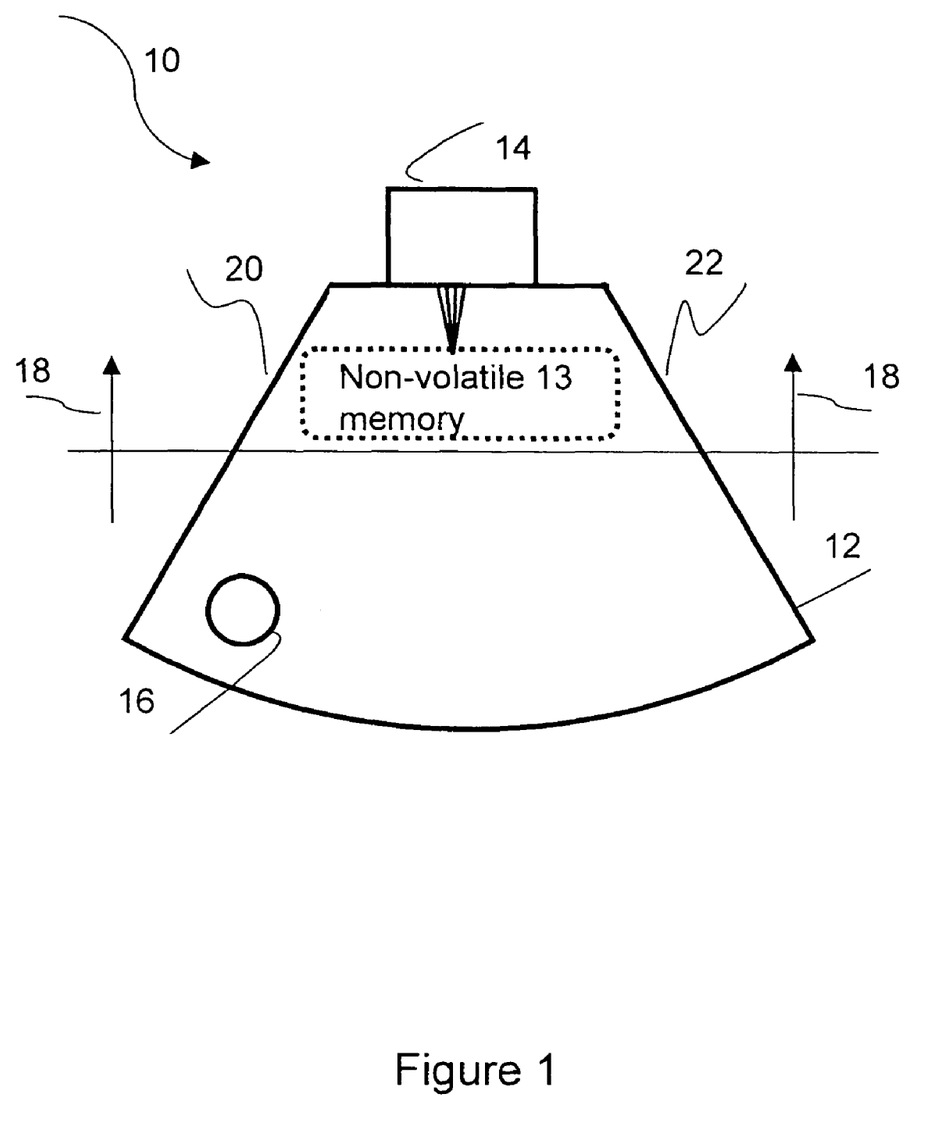
FIG. 1 is a preferred UFD device of the present invention.

Referring now to FIG. 1, there is shown a preferred UFD device 10 of the present invention. The UFD device 10 includes a housing 12 having a ring shape of preferably a 60-degree sector, with radii similar to radii of a standard CD ROM. A non-volatile memory 13 is embedded within housing 12.

The UFD device 10 includes a USB connector 14, such as a flat USB connector, available from IBDA Rishon Le-Zion, Israel, for connecting UFD device 10 to a host computing device.

The housing 12 of the UFD device 10 is designed to optionally include a hole 16 for conveniently attaching the UFD device 10 to other objects (e.g. a key chain). Two straight radial edges 20, 22 shaping the housing 12 of the UFD device 10, are designed with a protrusion on one side and a recess on the other side (see 34, 36 in FIG. 2A and 44, 46 in FIG. 2B, respectively).

Figure 2A:
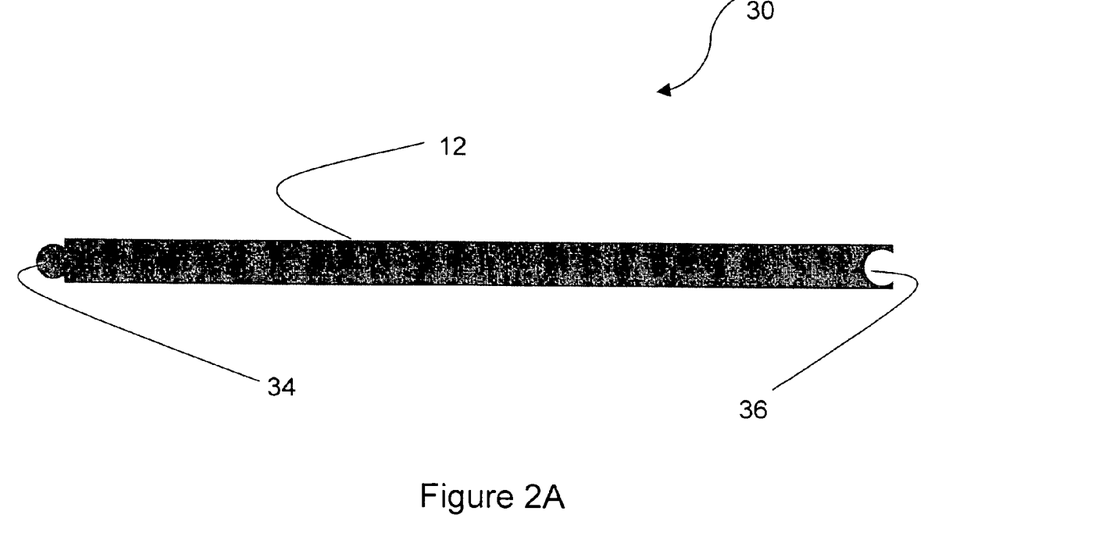
FIG. 2A is a cross-section of the preferred UFD device of the present invention.

Referring to FIG. 2A, there is shown a cross-section 30 of the preferred UFD device 10 of the present invention, along a line 18 of FIG. 1. The housing 12 of the UFD device 10 is typically made of an elastic material, such that one UFD device is mechanically connected to another UFD device by a snapping action.

A cylindrical protrusion 34 along an edge of one UFD device is plugged into a cylindrical recess 36 on the edge of another UFD device. The cylindrical protrusion 34 may be further plugged into a recess of an object that is not a UFD device, as described in FIG. 3.

Due to the elasticity of the material of the housing 12, the snapping action firmly seals two UFD devices together, as is commonly done in sealing sandwich bags ("double seal"). The diameter of the cylindrical protrusion 34 and the cylindrical recess 36 are such that the cylindrical protrusion 34 is pushed into the cylindrical recess 36 either by sliding the former along its axis or by forcing it laterally to be positioned within the cylindrical recess 36. The elasticity of the material ensures that the cylindrical protrusion 34 does not slide out of the cylindrical recess 36 unintentionally, unless reasonable force is applied on the former to pull it out.

Figure 2B:
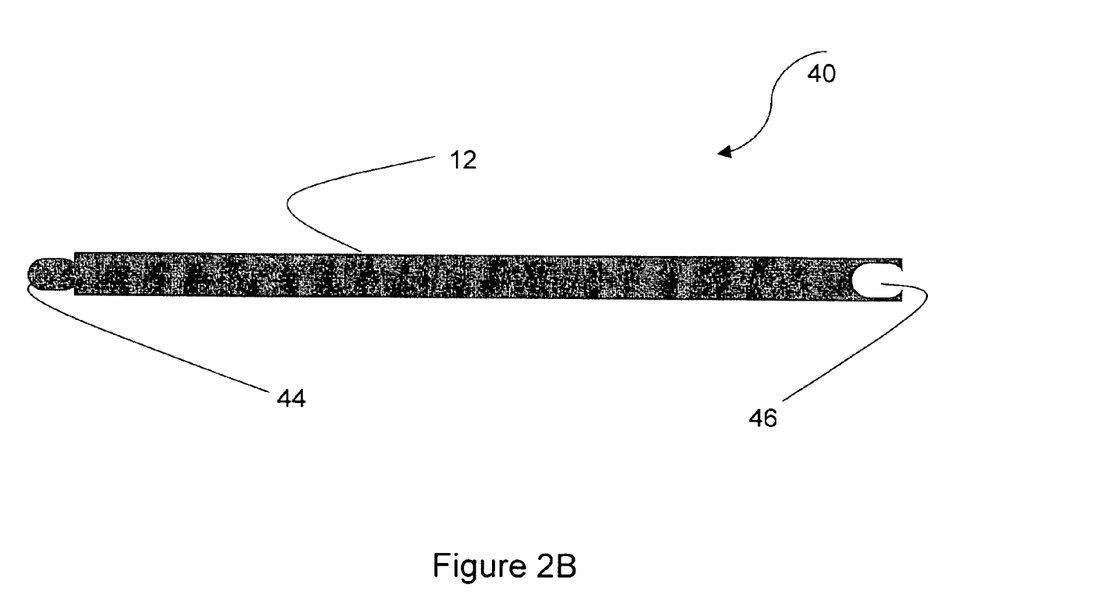
FIG. 2B is a cross-section of another preferred UFD device of the present invention.

Referring to FIG. 2B, there is shown a cross-section 40 of another preferred UFD device of the present invention, along a line 18 of FIG. 1. The housing 12 of the UFD device is typically made of an elastic material, such that one UFD device is mechanically connected to another UFD device by a snapping action.

A protrusion 44 along an edge of one UFD device is plugged into a recess 46 on the edge of another UFD device. In contrast to FIG. 2A, the protrusion 44 is not a circular cylinder, so that when the protrusion 44 is snapped into the recess 46 of another UFD device the shape of the protrusion 44 is resistant to bending, providing the protrusion 44 a better mechanical stability.

Figure 3:
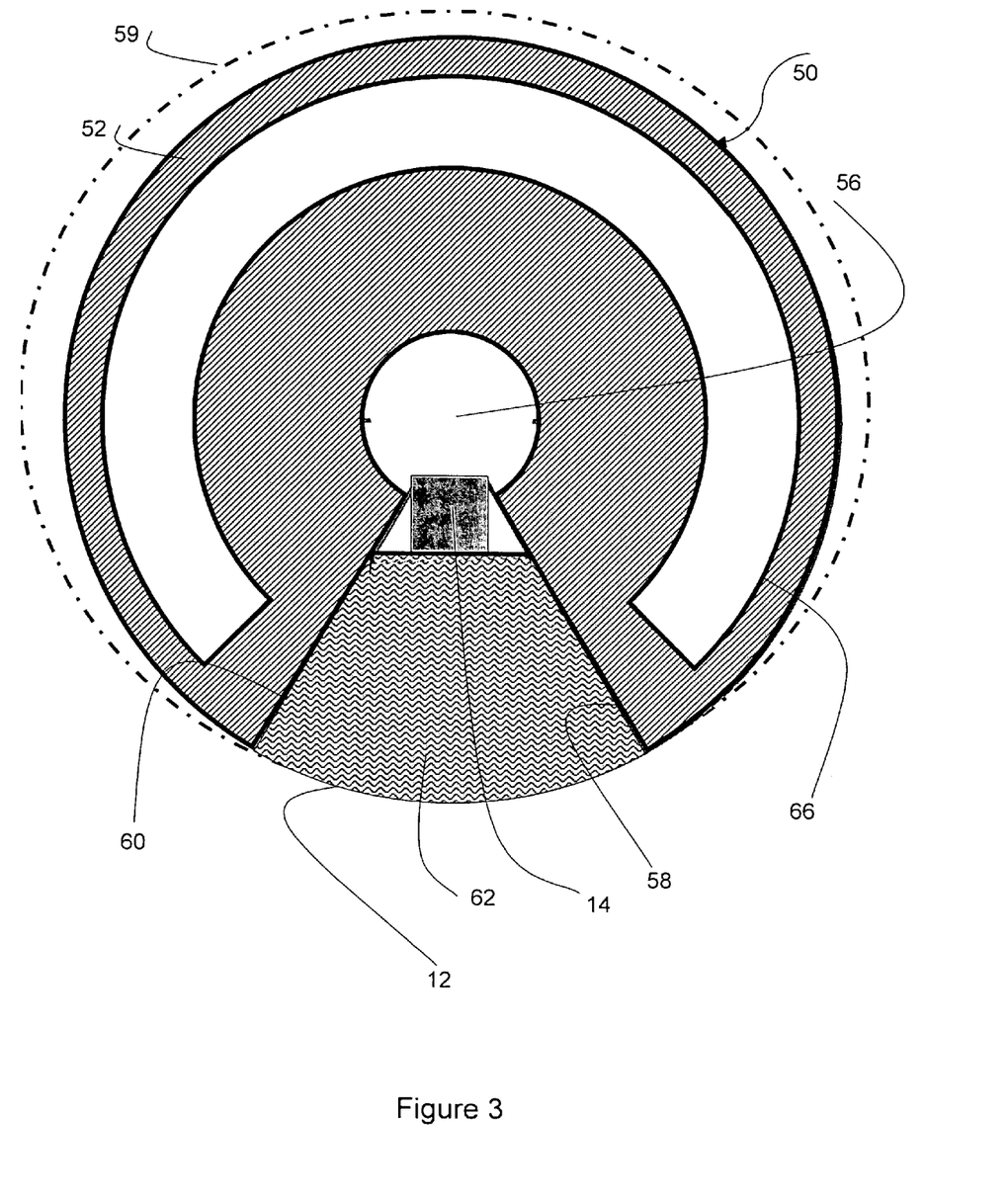
FIG. 3 shows a way of packaging a single UFD device of the present invention in a CD-like package.

Referring to FIG. 3, there is shown a way of packaging a single UFD device 62 of the present invention in a CD-like package. The UFD device 62 is shaped substantially as a 60 degrees sector of a ring, such that packaging of six such UFD devices obtains a shape of a complete ring.

The CD-like package 50 includes a UFD device 62 mechanically attached to two straight radial edges 58, 60, such that the two straight radial edges are a part of a ring-shaped protection cover 52 typically made of a plastic material and having an aperture angle defined by arc 59 that is approximately 360 degrees minus an aperture angle of the portable data storage device.

The inner diameter of the protection cover 52 is designed to provide enough space for containing the standard USB connector 14 within the inner connecting area 56 without overlapping on the protection cover 52. The packaging of the UFD device may further have a form factor of a standard CD. In other words, the size of the outer diameter of the protection cover 52 may be about 120 mm, which is similar in diameter to a standard CD.

The protective cover 52 has male and female snap latches along the two straight radial edges 58 and 60 respectively, so that the UFD device 62 is snapped into a sector of the protection cover 52 to become a substantially round object (e.g. as the shape of a CD).

Optionally, the thickness of the protective cover 52 and of the housing 12 of the UFD device can be smaller or larger than the area size of the USB connector 14, according to considerations of cost, mechanical properties and aesthetics. A label 66 can optionally be applied to the protective cover 52, thus enabling the designer or the consumer to label printed content that is relevant to the specific UFD device.

As shown herein, the protective cover 52 and housing 12 are reversibly operationally attached to each other. Packaging the protective cover 52 and housing 12 around a central pole—to resemble the way in which CDs are typically displayed and sold is provided by the present invention as optional. Alternatively, several packages 50 are stacked in a cylindrical container.

Figure 4:
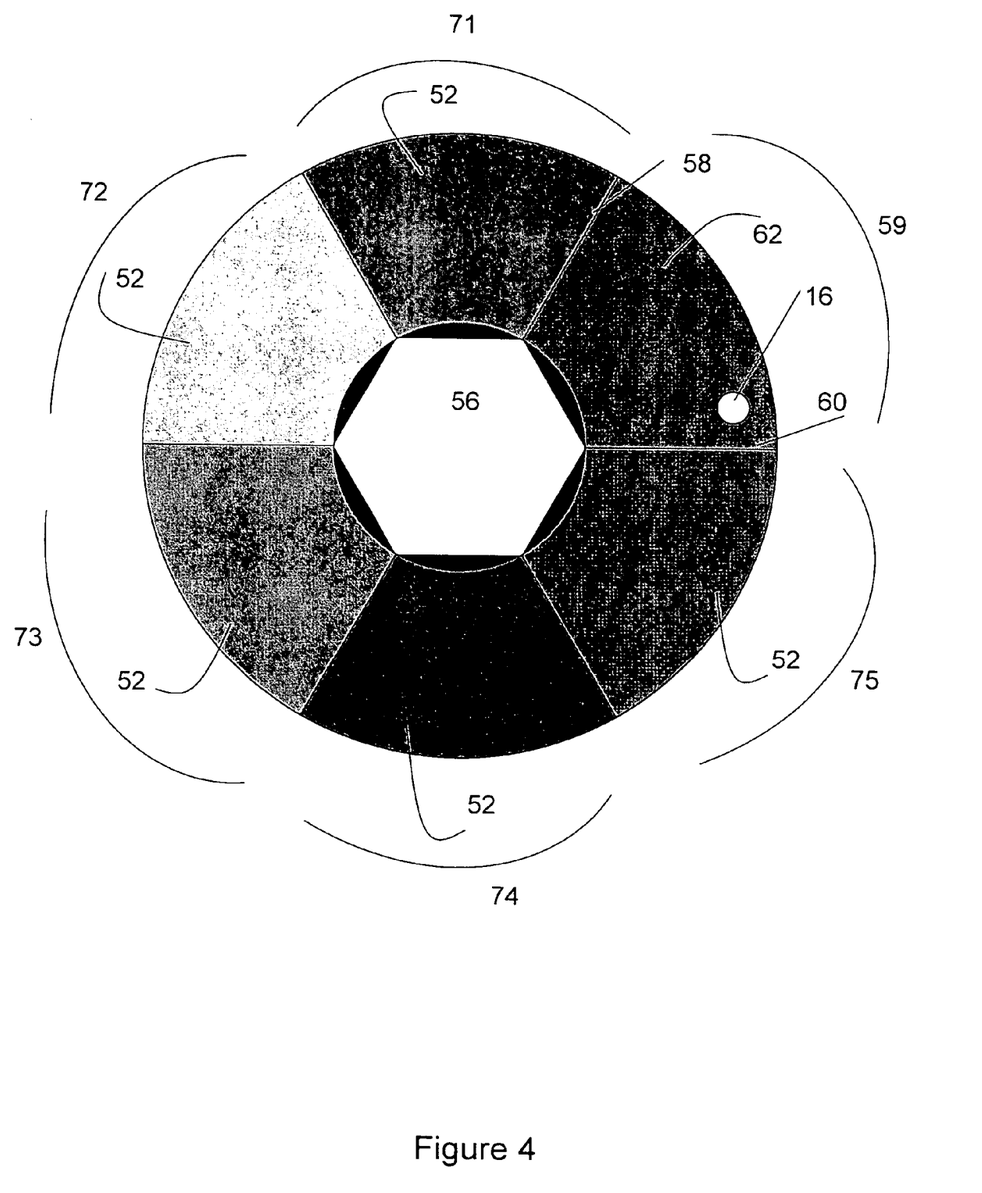
FIG. 4 shows another way of packaging the UFD device of the present invention in a plurality of ring-sector shaped protective covers.

Referring to FIG. 4, there is shown another way of packaging the UFD device 62 of the present invention in a plurality of ring-sector shaped protective covers 52, each having a respective aperture angle depicted by arcs 71, 72, 73, 74, and 75. The sum of all the aperture angles of protective covers 52 approximately equals 360 degrees minus the aperture angle of the portable data storage device (arc 59).

Figure 5:
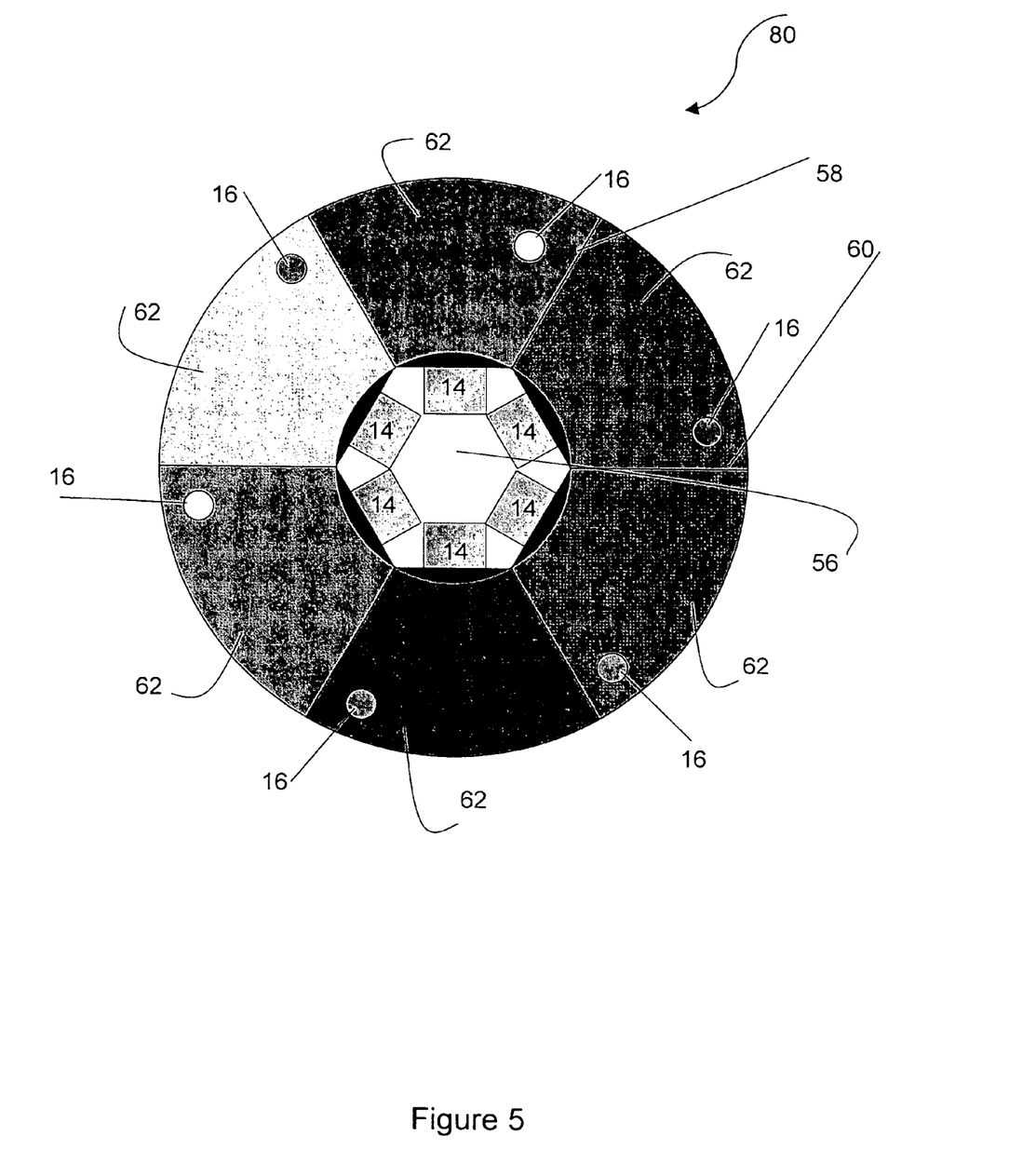
FIG. 5 shows a preferred way of packaging an even number of UFD devices of the present invention in a condensed form, to create a substantially round object.

Referring to FIG. 5, there is shown a preferred way for packaging an even number of UFD devices of the present invention in a condensed form, to create a substantially round object. There is shown a collection 80 of six UFD devices 62, for example, packaged in a condensed form to create a substantially round object of the interior shape and size of a typical CD carrying case, for example. The hole 16 optionally designed on each UFD device 62 enables to conveniently attach each UFD device 62 to other objects.

The six UFD devices 62 are snapped into each other using the male and female snaps latches, along the two straight radial edges 58 and 60. The hole 16, which is optionally designed on each UFD device 62, enables to conveniently attach each UFD device 62 to other objects. The USB connector 14 of each UFD device 62 is positioned within the center of the inner connecting area 56, so that each USB connector 14 is mechanically protected from being hit by other objects, even upon collection 80 falling on the floor.

The user can achieve this condensed form packaging by removing six UFD devices from their protective covers 52 (see FIG. 3), and connecting them to each other. Five UFD devices can be either slid into each other along the edges, or can be snapped laterally using the elasticity of the snap latches. The sixth UFD device can slide into place on only one of its edges, while the other edge is snapped laterally.

Figure 6:
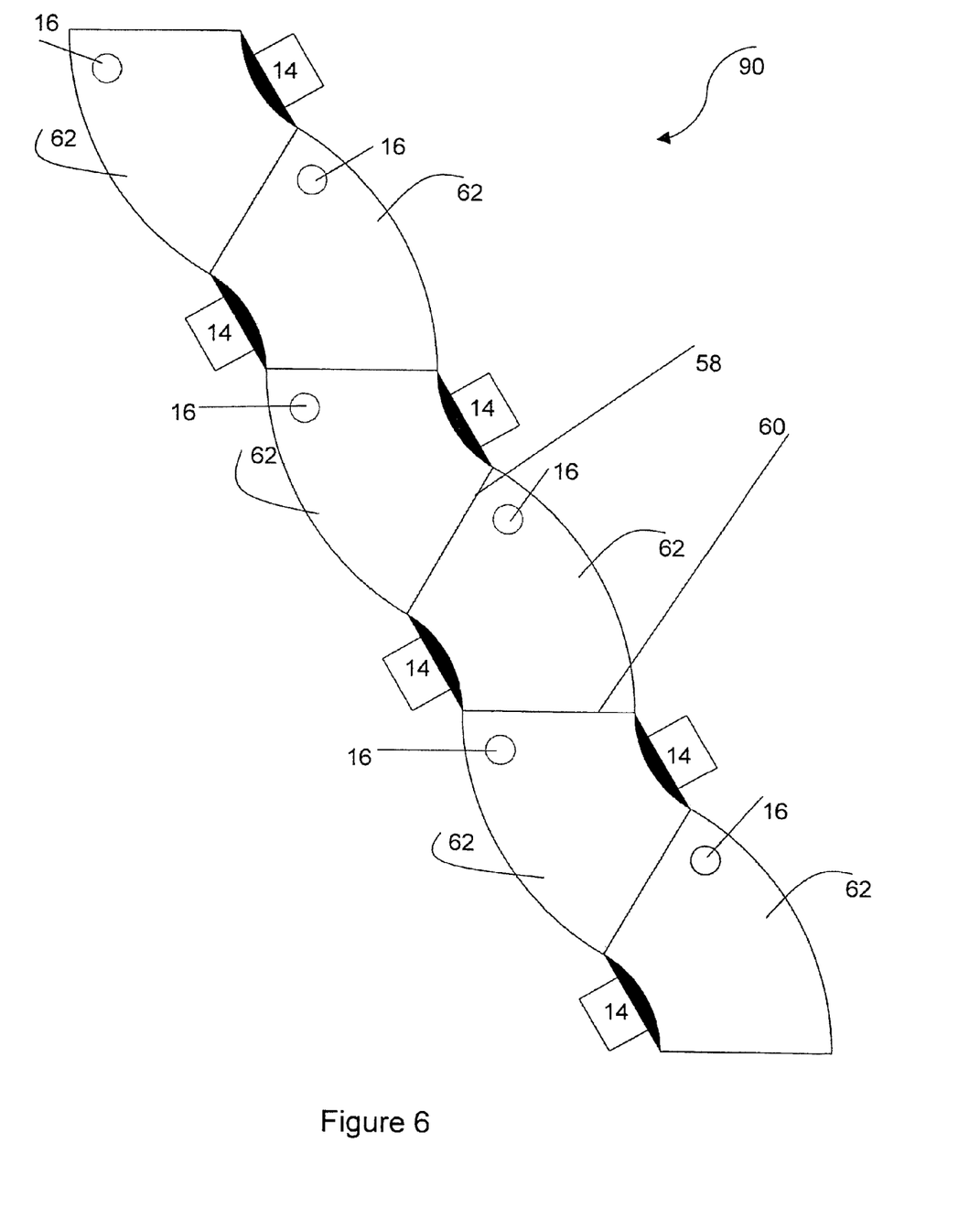
FIG. 6 shows another way of packaging UFD devices of the present invention in a condensed form, to create a substantially straight line.

Referring now to FIG. 6, there is shown another way for packaging UFD devices of the present invention in a condensed form, to create a substantially wavy line. There is shown a collection 90 of six UFD devices, for example, each including a USB connector 14. The UFD devices are packaged in a condensed form to create a substantially straight line. The six UFD devices are snapped into each other using the male and female snaps latches, along the two straight radial edges 58 and 60. The hole 16 optionally designed on each UFD device 62 enables to conveniently attach each UFD device 62 to other objects. Packaging the UFD devices in such a manner achieves an economic reduction in storage space when packaging a large number of such UFD devices (e.g. for a library or an archive).

Figure 7:
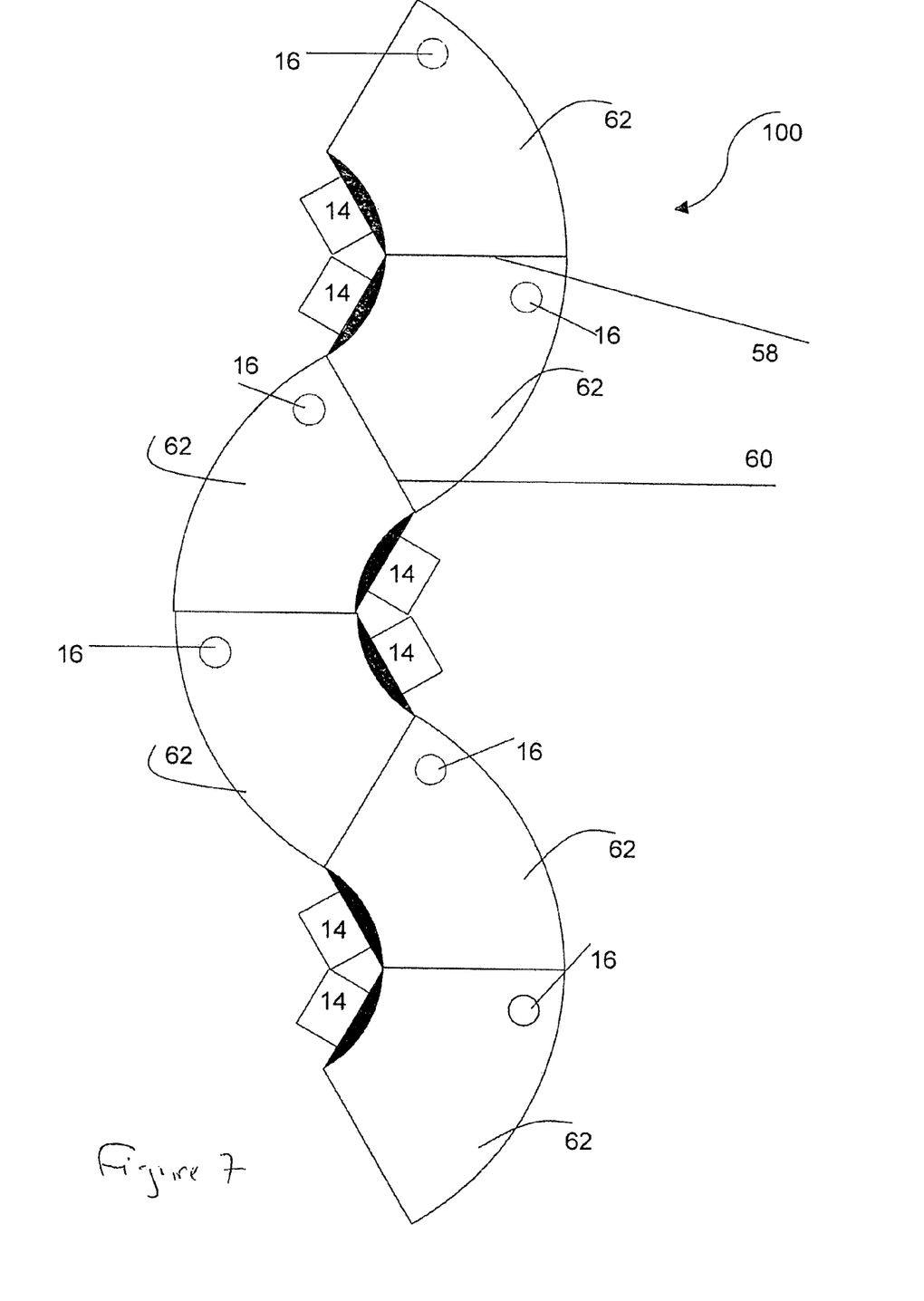
FIG. 7 shows yet another way of packaging together UFD devices of the present invention in a condensed form, such that the UFD devices are oriented packaged within concave areas of the condensed form.

Referring to FIG. 7, there is shown yet another way for packaging UFD devices of the present invention together in a condensed form. There is shown a collection 100 of six UFD devices for example, each including a USB connector 14, packaged in a condensed form. The six UFD devices are snapped into each other using the male and female snaps latches, along the two straight radial edges 58 and 60. The hole 16 optionally designed on each UFD device 62 enables to conveniently attach each UFD device 62 to other objects. The USB connectors 14 are oriented packaged within concave areas of the condensed form, so that they are well protected mechanically.

Figure 8:
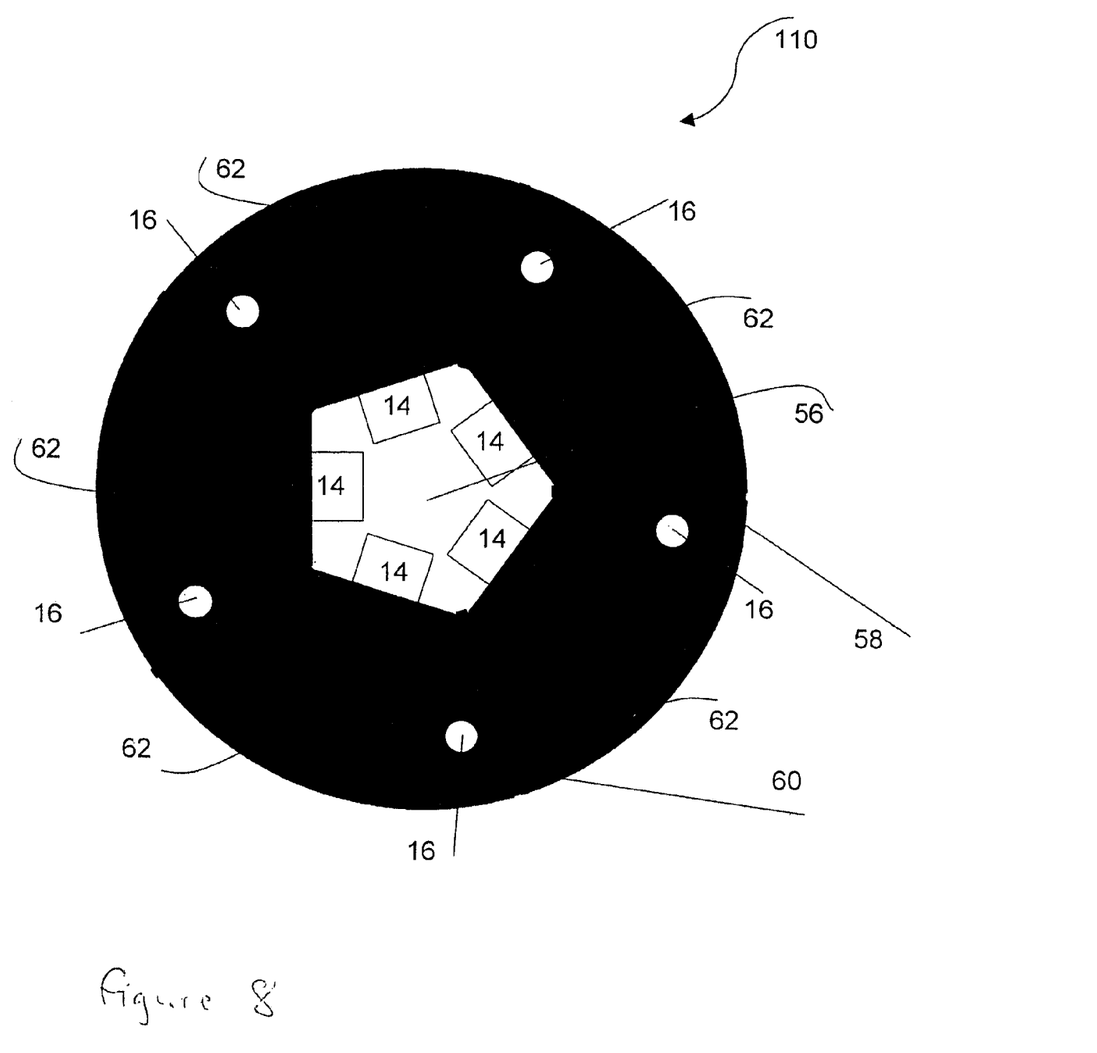
FIG. 8 shows a way of packaging together an odd number of UFD devices of the present invention in a condensed form, to create a substantially round object.

Referring to FIG. 8, there is shown a way for packaging together an odd number of UFD devices of the present invention in a condensed form. There is shown a collection 110 of five UFD devices, for example, packaged in a condensed form to create a substantially round object having a form factor of a CD. The five UFD devices are snapped into each other using the male and female snaps latches, along the two straight radial edges 58 and 60. Hole 16 optionally designed on each UFD device 62 enables to conveniently attach each UFD device 62 to other objects. The USB connector 14 of each UFD device 62 is positioned within the center of the inner connecting area 56, so that each USB connector 14 is mechanically protected from being hit by other objects, even upon collection 110 falling on the floor.

Packaging an odd number of UFD devices in such a manner is preferred to packaging an even number of UFD device, since the packaging of an odd number of UFD devices avoids the existence of collinear pairs of snap latches across the round object. A collinear pair of snap latches (see FIG. 4) tends to become an axis of bending, which decreases the mechanical stability of the UFD devices' packaging.

Figure 9:
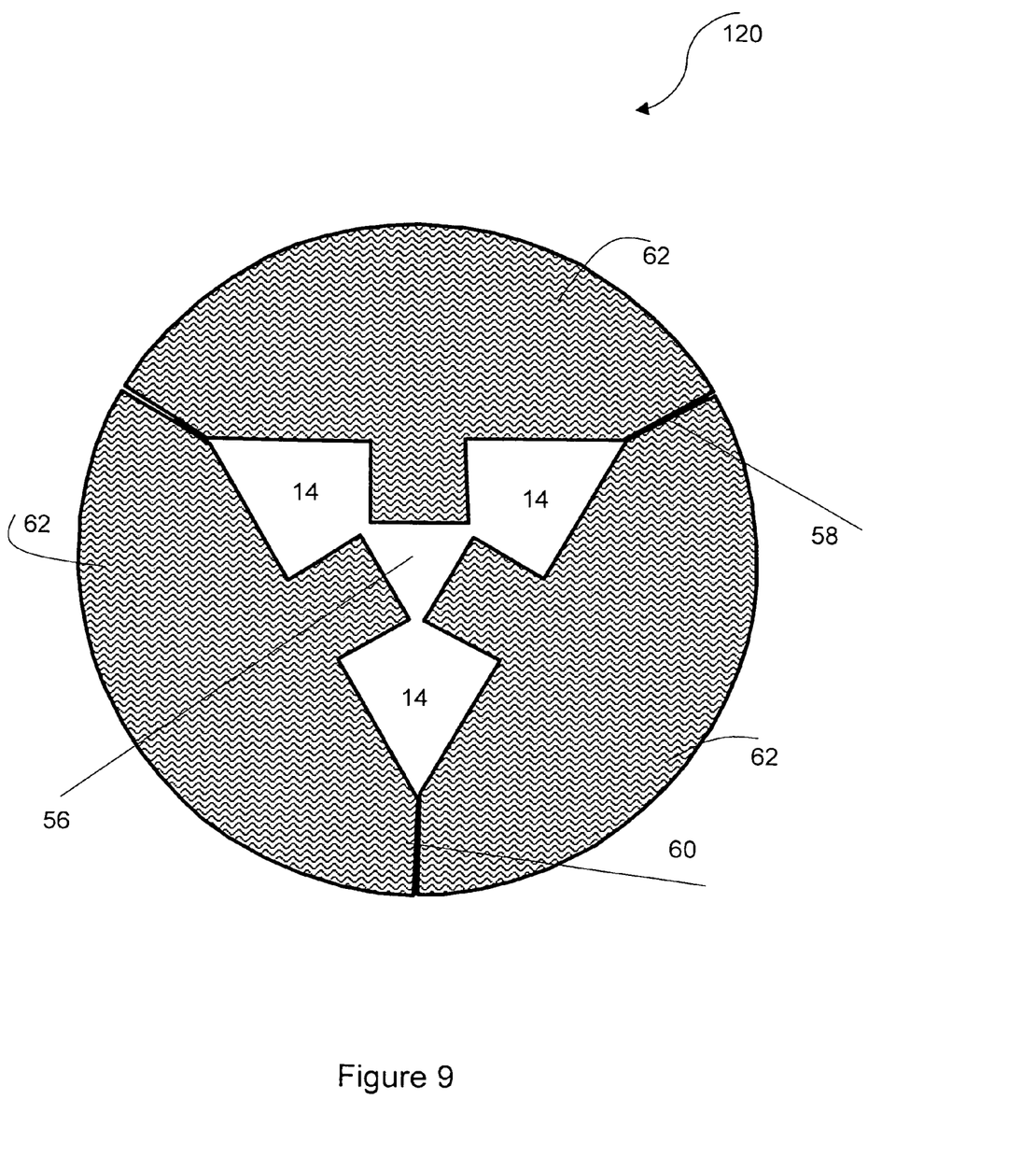
FIG. 9 shows a second way of packaging together an odd number of UFD devices of the present invention in a condensed form, to create a substantially round object.

Referring to FIG. 9, there is shown a second way for packaging an odd number of UFD devices of the present invention in a condensed form. There is shown a collection 120 of three UFD devices, for example, packaged in a condensed form, exemplifying that the UFD device 62 of the present invention may be designed to be of any shape (i.e. the projections of the two straight radial edges 58 and 60 to the center of collection 120 can meet at any angle, preferably 360 degrees divided by an integer greater than 2). The three UFD devices are snapped into each other using the male and female snap latches, along the two straight radial edges 58 and 60. The USB connector 14 of each UFD device 62 is positioned within the center of the inner connecting area 56, so that each USB connector 14 is mechanically protected from being hit by other objects, even upon collection 120 falling on the floor.

Figure 10:
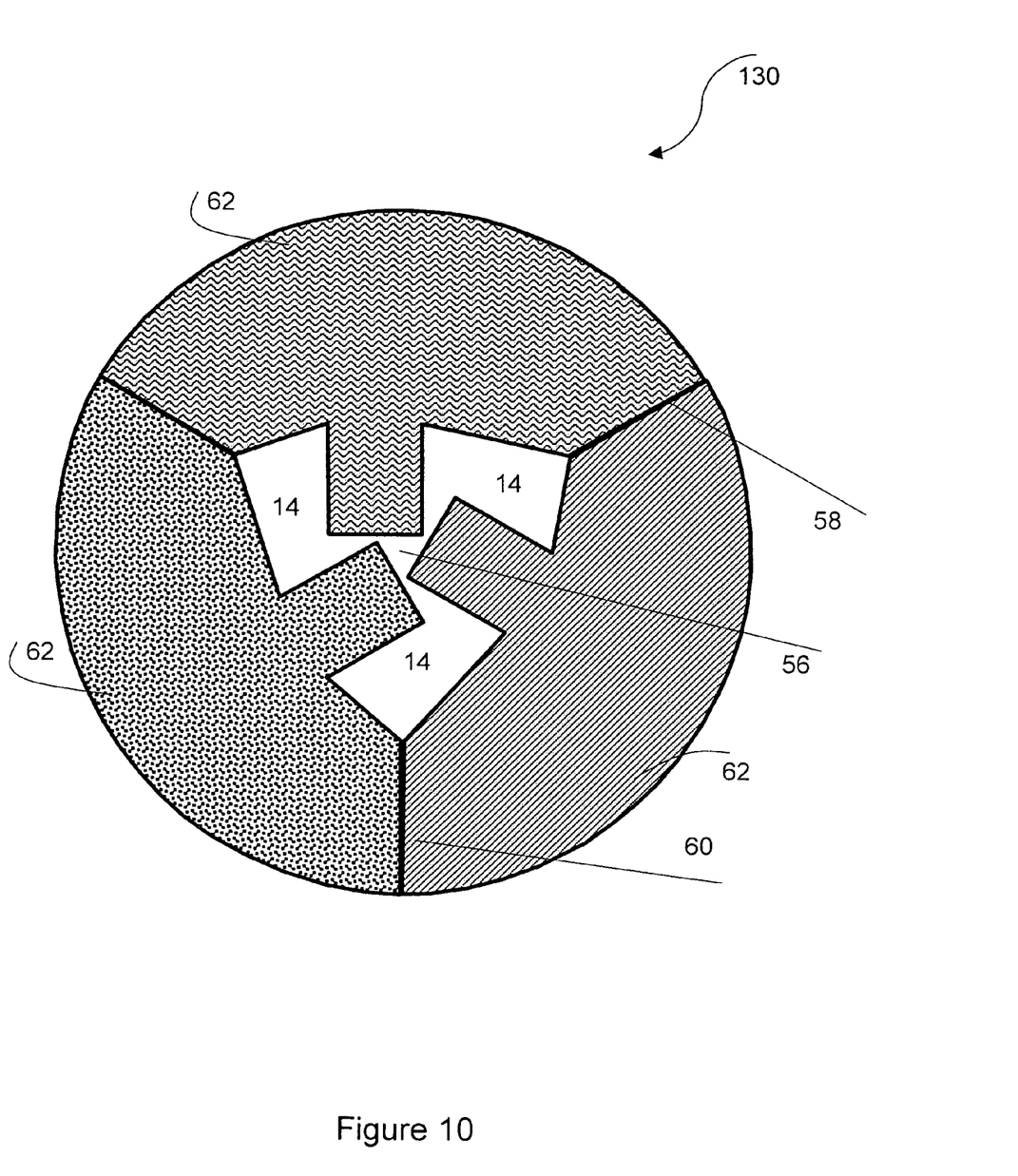
FIG. 10 shows a third way of packaging together an odd number of UFD devices of the present invention in a condensed form, to create a substantially round object.

Referring to FIG. 10, there is shown a third way for packaging an odd number of UFD devices of the present invention in a condensed form. There is shown a collection 130 of three UFD devices, for example, snapped into each other using the male and female snaps latches, along the two straight radial edges 58 and 60. The USB connectors 14 of the three UFD devices 62 are not centered on the inward-facing edges of the three UFD device 62, so that packaging of UFD devices according to collection 130 is more compact than packaging according to collection 120.

Figure 11:
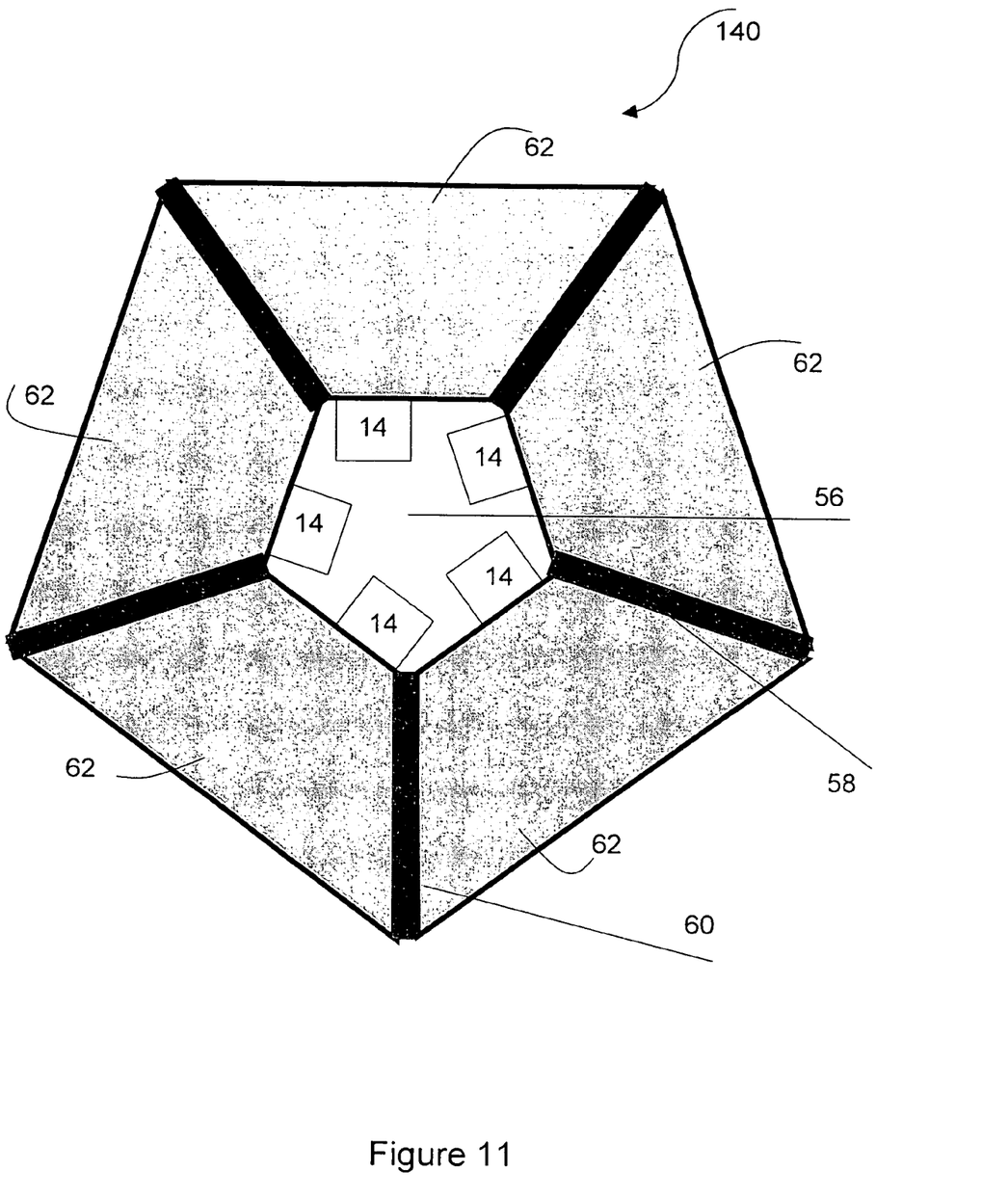
FIG. 11 shows another way of packaging UFD devices of the present invention in a condensed form, to create a polygonal shape.

Referring to FIG. 11, there is shown another way for packaging UFD devices of the present invention in a condensed form, to create a polygonal shape. There is shown a collection 140 of five UFD devices, for example, packaged together in a condensed form to create a polygonal shape. The UFD devices are snapped into each other using the male and female snaps latches, along the two straight radial edges 58 and 60. The USB connector 14 of each UFD device 62 is positioned within the center of the inner connecting area 56, so that each USB connector 14 is mechanically protected from being hit by other objects, even upon collection 140 falling on the floor.

Figure 12A:
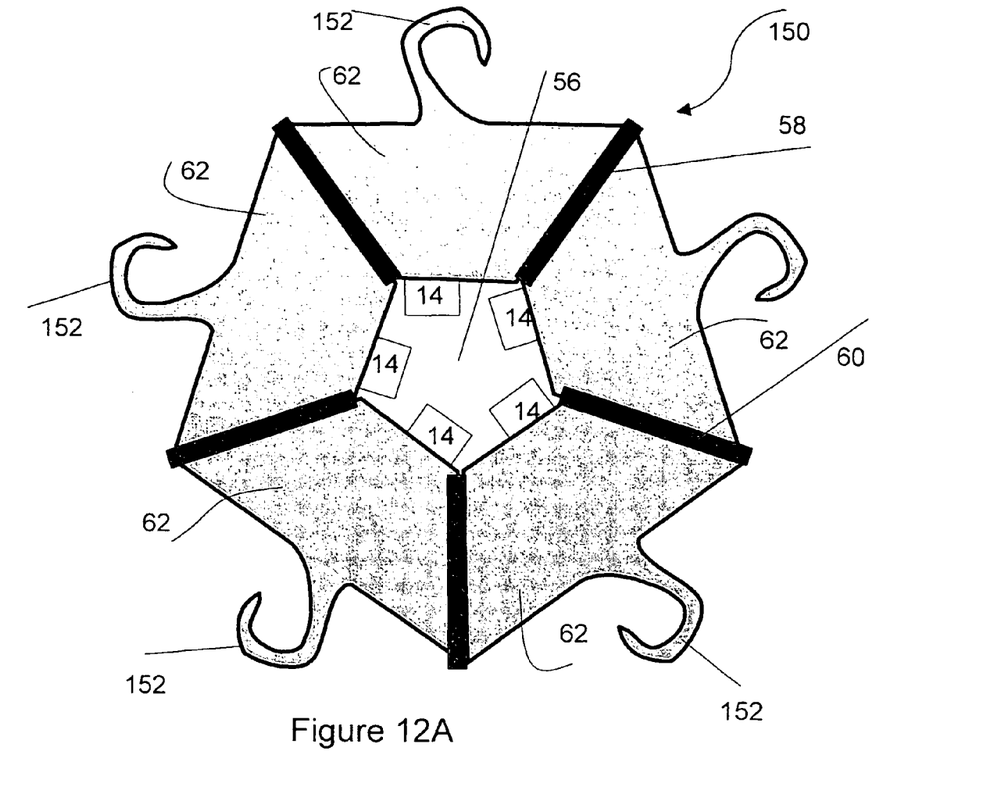
FIG. 12A shows a way of shaping UFD devices of the present invention to facilitate hanging the UFD devices on a horizontal rod.

Referring to FIG. 12A, there is shown a way for shaping UFD devices of the present invention to facilitate hanging the UFD devices on a horizontal rod. Each UFD device includes a hook on its external edge. There is shown a collection 150 of five UFD devices 122 in this example, each UFD device 62 including a hook 152 on its external edge. This hook 152 can be used for hanging an arbitrarily large number of UFD devices on a horizontal rod, to become a library of UFD devices for example, enabling the user to push a required UFD device along the horizontal rod and read its label without changing the position of other UFD devices packaged on the horizontal rod. The UFD devices of each collection 150 are snapped into each other using the male and female snaps latches, along the two straight radial edges 58 and 60. The USB connector 14 of each UFD device 62 is positioned within the center of the inner connecting area 56, so that each USB connector 14 is mechanically protected from being hit by other objects, even upon collection 150 falling on the floor.

Figure 12B:
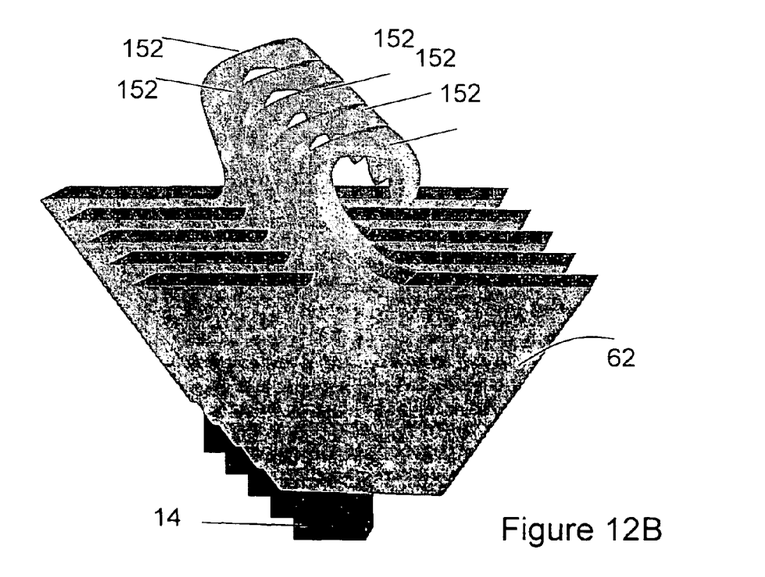
FIG. 12B shows a way of packaging the UFD devices of FIG. 11A in a row.

Referring to FIG. 12B, there is shown a way of packaging the UFD devices of FIG. 11A in a row. Each of the UFD devices 62 includes a USB connector 14 as well as a hook 152 on its external edge.

Having described the invention with regard to certain specific embodiments thereof, it is to be understood that the description is not meant as a limitation, since further modifications will now suggest themselves to those skilled in the art, and it is intended to cover such modifications as fall within the scope of the appended claims.

The invention claimed is:

1. A portable data storage device comprising:
   (a) a housing shaped as a wedge to facilitate packaging of the portable data storage device into an object having a shape of a ring;
   (b) a non-volatile memory, within said housing, for storing digital information; and
   (c) an electrical connector for connecting said non-volatile memory to a host.

2. The portable data storage device of claim 1 further comprising:
   (d) a ring-sector shaped protective cover having an arc length that is substantially 360 degrees minus an arc length of the portable data storage device.

3. The portable data storage device of claim 1 further comprising:
   (d) a plurality of ring-sector shaped protective covers each having a respective arc length, such that a sum of all of said respective arc lengths substantially equals 360 degrees minus an arc length of the portable data storage device.

4. The portable data storage device of claim 1, wherein said housing is shaped substantially as a sector of a ring.

5. The portable data storage device of claim 1, wherein said housing includes a connecting mechanism for packaging together the portable data storage device with other such portable data storage devices.

6. The portable data storage device of claim 5, wherein said connecting mechanism for packaging together the portable data storage device with said other such portable data storage devices includes respective snap latches on opposite sides of said housing.

7. The portable data storage device of claim 5, wherein said connecting mechanism is for packaging together the portable data storage device with said other such portable data storage devices substantially in a co-planar manner.

8. The portable data storage device of claim 5, wherein said connecting mechanism is for packaging together the portable data storage device with said other such portable data storage devices substantially in a shape of a complete ring.

9. The portable data storage device of claim 8, wherein said shape of said complete ring has dimensions of a standard CD ROM.

10. The portable data storage device of claim 1, wherein said electrical connector is a USB connector.

11. A method for packaging a portable data storage device, the method comprising the steps of:
    (a) configuring a housing of the portable data storage device to facilitate a packaging of the portable data storage device in a ring-shaped object; and
    (b) packaging the portable data storage device in said ring-shaped object, wherein said packaging yields a substantially co-planar collection of a plurality of portable data storage devices.

12. The method of claim 11, wherein said housing is shaped substantially as a sector of said ring-shaped object.

13. The method of claim 11 wherein said packaging yields a collection of a plurality of portable data storage devices shaped substantially as a complete ring.

14. The method of claim 13, wherein said shape of said complete ring has dimensions of a standard CD ROM.

15. The method of claim 11, wherein the portable data storage device is packaged in said ring-shaped object with a ring-sector shaped protective cover having an arc length that is substantially 360 degrees minus an arc length of the portable data storage device.

16. The method of claim 11, wherein the portable data storage device is packaged in said ring-shaped object with a plurality of ring-sector shaped protective covers each having a respective arc length, such that a sum of all of said respective arc lengths substantially equals 360 degrees minus an arc length of the portable data storage device.

17. A method of distributing at least one portable data storage device, the method comprising the steps of:
    (a) configuring a housing of each portable data storage device to facilitate a packaging of the at least one portable data storage device in a ring-shaped object; and
    (b) packaging the at least one portable data storage device with at least one other similarly configured device.

18. The method of claim 17, wherein said packaging yields a collection of a plurality of portable data storage devices shaped substantially as a complete ring.

19. The method of claim 18, wherein said shape of said complete ring has dimensions of a standard CD ROM.

20. The method of claim 17, wherein the portable data storage device is reversibly packaged in said ring-shaped object with a ring-sector shaped protective cover having an arc length that is substantially 360 degrees minus an arc length of the portable data storage device.

21. The method of claim 17, wherein the portable data storage device is packaged in said ring-shaped object with a plurality of ring-sector shaped protective covers each having an arc length that is substantially 360 degrees minus an arc length of the portable data storage device.

* * * * *